(12) United States Patent
Ortler

(10) Patent No.: US 7,948,326 B2
(45) Date of Patent: May 24, 2011

(54) METHOD FOR CARRYING OUT A FREQUENCY CHANGE

(75) Inventor: Georg Ortler, Gessertshausen (DE)

(73) Assignee: Rohde & Schwarz GmbH & Co. KG, München (DE)

(*) Notice: Subject to any disclaimer, the term of this patent is extended or adjusted under 35 U.S.C. 154(b) by 439 days.

(21) Appl. No.: 12/063,646

(22) PCT Filed: Jan. 5, 2007

(86) PCT No.: PCT/EP2007/000071
§ 371 (c)(1),
(2), (4) Date: Mar. 20, 2008

(87) PCT Pub. No.: WO2007/080073
PCT Pub. Date: Jul. 19, 2007

(65) Prior Publication Data
US 2010/0141305 A1   Jun. 10, 2010

(30) Foreign Application Priority Data

Jan. 10, 2006 (DE) .................. 10 2006 001 284
Feb. 15, 2006 (DE) .................. 10 2006 007 042
Mar. 31, 2006 (DE) .................. 10 2006 015 039

(51) Int. Cl.
*G01R 23/00* (2006.01)
*G01R 27/00* (2006.01)
*H03L 7/00* (2006.01)

(52) U.S. Cl. .............. 331/44; 331/2; 331/14; 331/16; 331/25

(58) Field of Classification Search .............. 331/2, 4, 331/14, 16–18, 25, 44, 74, 179; 324/76.11, 324/76.23, 600, 638
See application file for complete search history.

(56) References Cited

U.S. PATENT DOCUMENTS

| 4,647,847 A | 3/1987 | Roos |
| 4,677,394 A * | 6/1987 | Vollmer .................. 331/1 A |
| 6,549,862 B1 | 4/2003 | Huang et al. |
| 6,970,000 B2 | 11/2005 | Evers et al. |

FOREIGN PATENT DOCUMENTS

| DE | 102 46 700 | 4/2004 |
| DE | 103 31 092 | 2/2005 |

* cited by examiner

*Primary Examiner* — David Mis
(74) *Attorney, Agent, or Firm* — Marshall, Gerstein & Borun LLP

(57) ABSTRACT

The invention relates to a method for carrying out a frequency change whilst retaining the phase relationship between several devices, in particular, network analyzers. Each device has at least one signal generator for stimulating an object for measurement and at least one local oscillator, connected to at least one mixer, for receiving a measuring signal obtained from the object for measurement by the superposition principle. On changing frequency, in a first step, only the frequency of the local oscillators of all devices is changed and the frequency of the signal generators of all devices remains unchanged. In a second step, only the frequency of at least one signal generator is changed and the frequency of the local oscillators of all devices remains unchanged.

6 Claims, 5 Drawing Sheets

METHOD FOR CARRYING OUT A FREQUENCY CHANGE

BACKGROUND OF THE INVENTION

1. Field of the Invention

The invention relates to a method for the implementation of a frequency change while retaining the phase relationship, especially in network analyzers.

2. Related Technology

An arrangement for phase synchronization is known from DE 103 31 092 A1. With this arrangement for phase synchronization, several measuring devices, especially network analyzers, are combined to form a measuring system. The individual measuring devices are connected to one another by a connecting line in such a manner that the individual phase-locked loops (PLL) preserve the same reference frequency. This document makes no reference to a special procedure during a frequency change, wherein the phase relationship defined by the synchronization is preserved.

A vectorial network analyzer with controllable signal generators and controllable oscillators is known from DE 102 46 700 A1. However, this document makes no reference to how, in particular, several devices of this kind can be coordinated during a frequency change.

SUMMARY OF THE INVENTION

The invention therefore provides a method for implementing the frequency change, which functions reliably and ensures the preservation of the phase relationship.

Accordingly, the invention provides a method for the implementation of a frequency change while retaining the phase relationship between several devices, especially network analyzers, wherein each device provides at least one signal generator for the excitation of a device under test and at least one local oscillator connected to at least one mixer for the reception of a test signal obtained from the device under test according to the superposition principle, wherein, in the event of a frequency change, in a first stage, only the frequency of the local oscillators of all devices is initially varied, and the frequency of the signal generators of all devices remains unchanged; and in a second stage, only the frequency of at least one signal generator of at least one device is varied, and the frequency of the local oscillators of all devices remains unchanged or that, in the event of the frequency change, in a first stage, only the frequency of at least one signal generator of at least one device is initially varied, and the frequency of the local oscillators of all devices remains unchanged; and in a second stage, only the frequency of the local oscillators of all devices is varied, and the frequency of the signal generators of all devices remains unchanged.

It is possible to vary oscillators of all devices, and to leave the frequency of the signal generators of all devices unchanged, and then in a second stage only to change the frequency of the signal generators active in the excitation, and in this context, to leave the frequency of the local oscillators unchanged, or to proceed vice versa.

This two-stage procedure of the first alternative has the advantage, that in the first stage, the excitation of the device under test remains unchanged, because the frequency of the signal generators is not varied. Any changes in the phase position, which may occur during this first stage, cannot therefore be caused by the device under test, but must have been caused by the frequency change of the local oscillators. These phase changes caused by the frequency change of the local oscillators must not influence the measurement and must either be included in the subsequent evaluation calculations or corrected or compensated by changing the phase position of the local oscillators. If the influence of the device under test is slight, for example, as a result of a directional coupler providing good insulation, it is also possible to proceed vice versa.

In this context, the step width of the frequency change should be smaller than half the bandwidth of the intermediate-frequency range adjoining the mixer, in order to ensure that the signal can still be safely received even after the changing frequency error between the first and second stage.

In order to allow even larger frequency changes, for example, in the event of a return from the end frequency to the start frequency of a sweep process, it is proposed in one further development of the invention, initially to vary only the integer component of the division factor of the dividers conventionally present in the PLL synthesisers in the context of a rough frequency change. If only the integer component of the division factor is varied, the phase position does not change, and, to this extent, no correction is required. The step width still required for the remaining fine frequency change is generally smaller than half the bandwidth of the intermediate-frequency range. This change can then once again be implemented in such a manner that only the frequency of the local oscillators is initially varied, the frequency of the signal generators not being varied until after this. The inverse procedure is also possible.

BRIEF DESCRIPTION OF THE DRAWING

An exemplary embodiment of the invention is described below with reference to the drawings. The drawings are as follows.

DETAILED DESCRIPTION

Before describing the method according to the invention, an arrangement for phase synchronization, which is suitable for the implementation of the method according to the invention, will first be described with reference to FIGS. 1 to 4.

Figure 1:
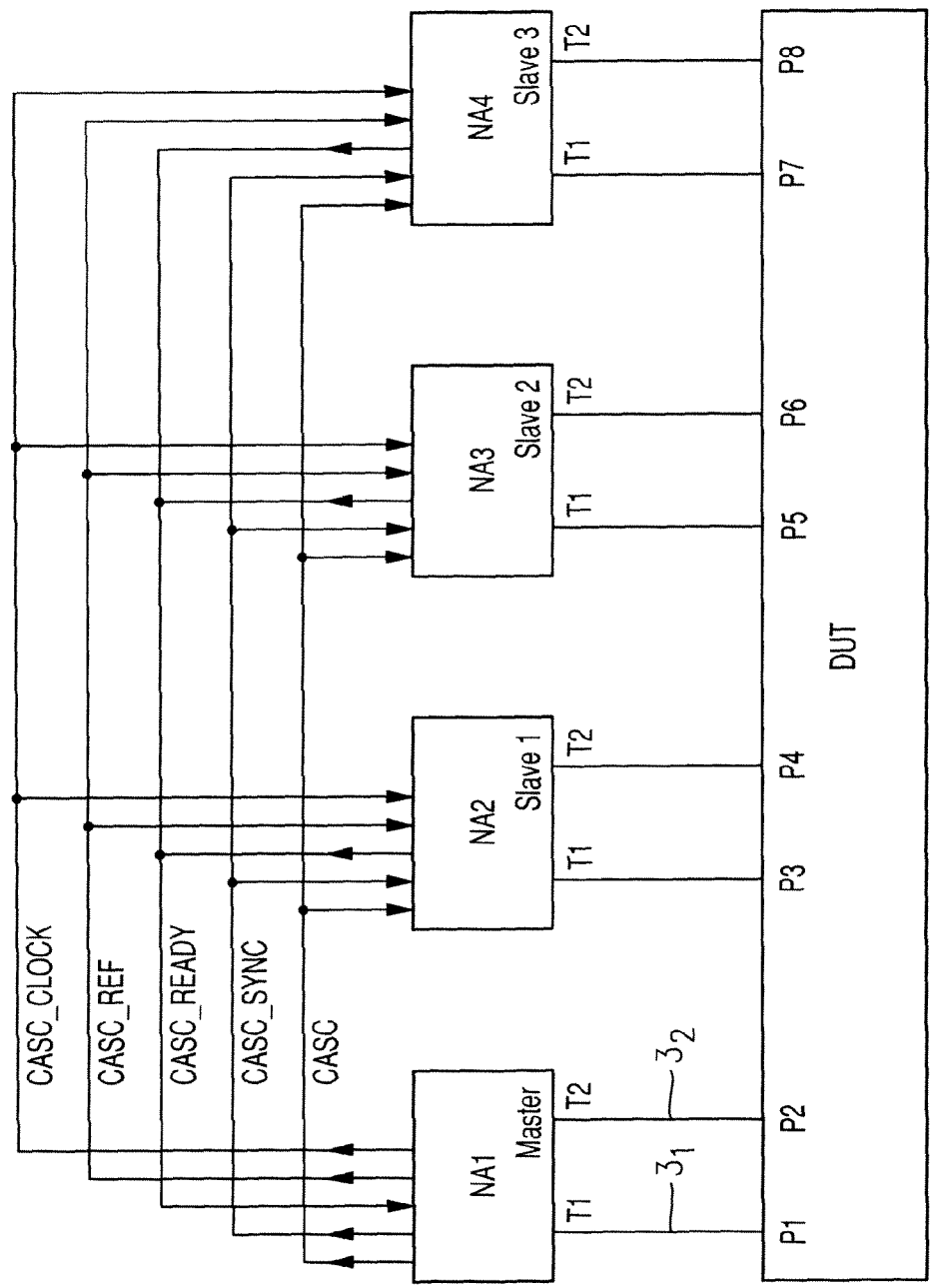
FIG. 1 shows a block circuit diagram of an arrangement for phase synchronization, which can be used in the method according to the invention.

FIG. 1 shows an overview block-circuit diagram of the arrangement for phase synchronization. Several measuring devices, for example, network analyzers NA1, NA2, NA3, NA4, but also, for example, spectrum analyzers, are to be connected together to form a combined measuring device. This may be necessary, for example, because the individual measuring devices, especially network analyzers, each provide only two test ports T1 and T2, but the device under test (DUT) has several input and output ports P1, P2, P3, P4, P5, P6, P7 and P8, which must be tested simultaneously. In this context, an accurate measurement of the phase position of the measurement signals with reference to the phase position of the excitation signals must be achieved. For example, the device under test DUT could be excited at its ports P1 and P2 by a first network analyzer NA1 with a differential signal (differential mode), wherein, in the differential mode, the signals to be generated at the ports T1 and T2 of the network analyzer NA1 must have an exact phase difference of 180°. The other ports P3 to P8 may, for example, be output ports of the device under test, wherein it is important to measure the exact phase position with reference to the excitation signal at each port P3 to P8.

Figure 3:
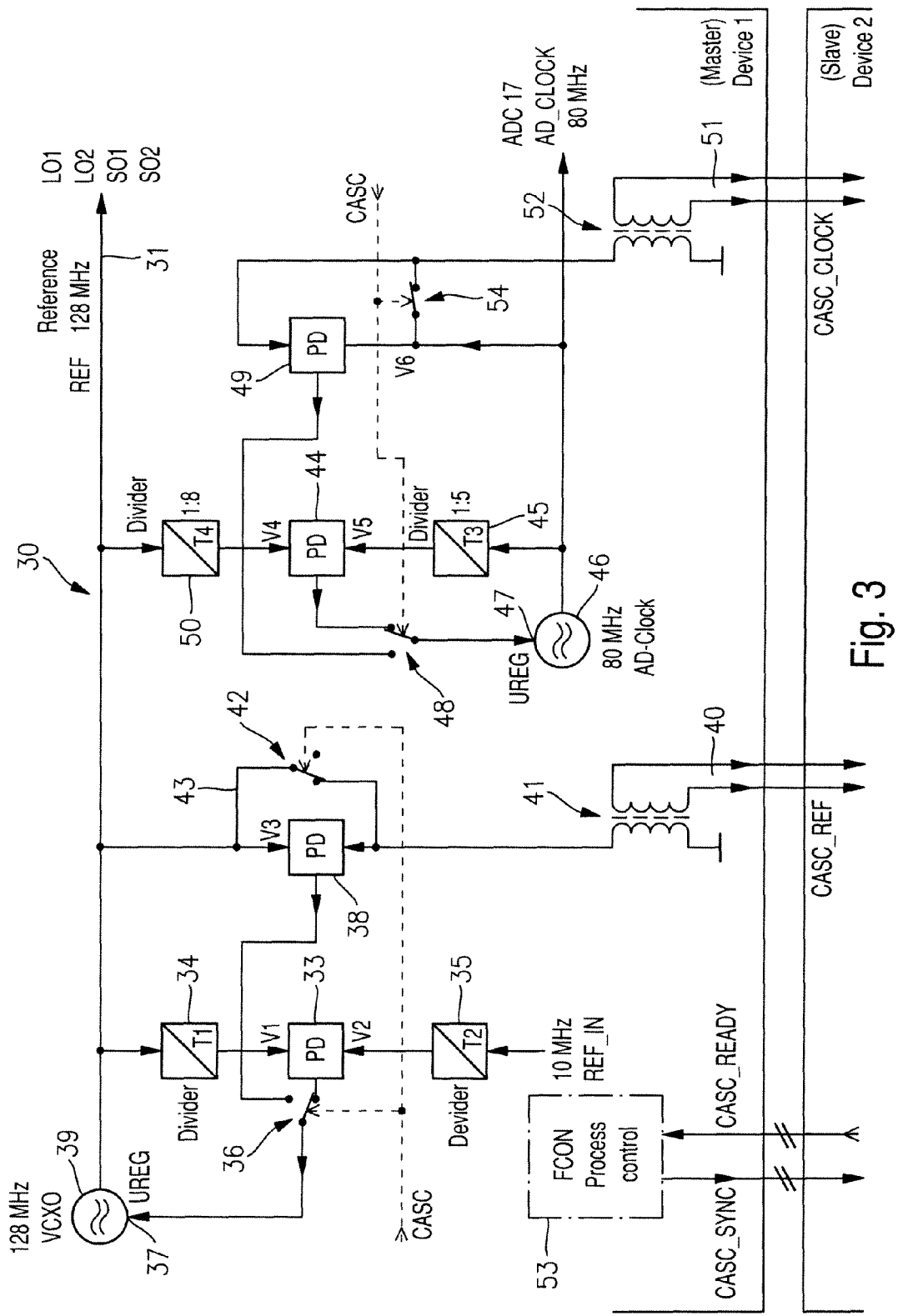
FIG. 3 shows an exemplary embodiment of a phase synchronization unit for the synchronization of a reference frequency and a clock-pulse signal.

In order to achieve this, one of the measuring devices, in the example illustrated in FIG. 1, measuring device NA1, is operated as the superordinate device (master), and the other measuring devices, in the example illustrated in FIG. 1, the measuring devices NA2, NA3, NA4, are operated as subordinate devices (slaves) to the master device NA1. For this purpose, the master device NA1 initially communicates via the signal CASC to the other devices NA2 to NA4 that it requires an interconnection (cascading) and that it will be the master in this measuring task. Following this, the switching devices in the individual measuring devices, which will be explained subsequently with reference to FIG. 3, are set to the appropriate switching position.

With the request CASC_SYNC, the master device NA1 interrogates the slave devices NA2 to NA4 regarding whether the switching process is complete. The devices NA2 to NA4 confirm this with the signal CASC_READY. In this configuration, the master device NA1 then supplies the slave devices NA2 to NA4 with a reference signal CASC_REF and, in the preferred exemplary embodiment presented, additionally provides a clock-pulse signal CASC_CLOCK.

Figure 2:
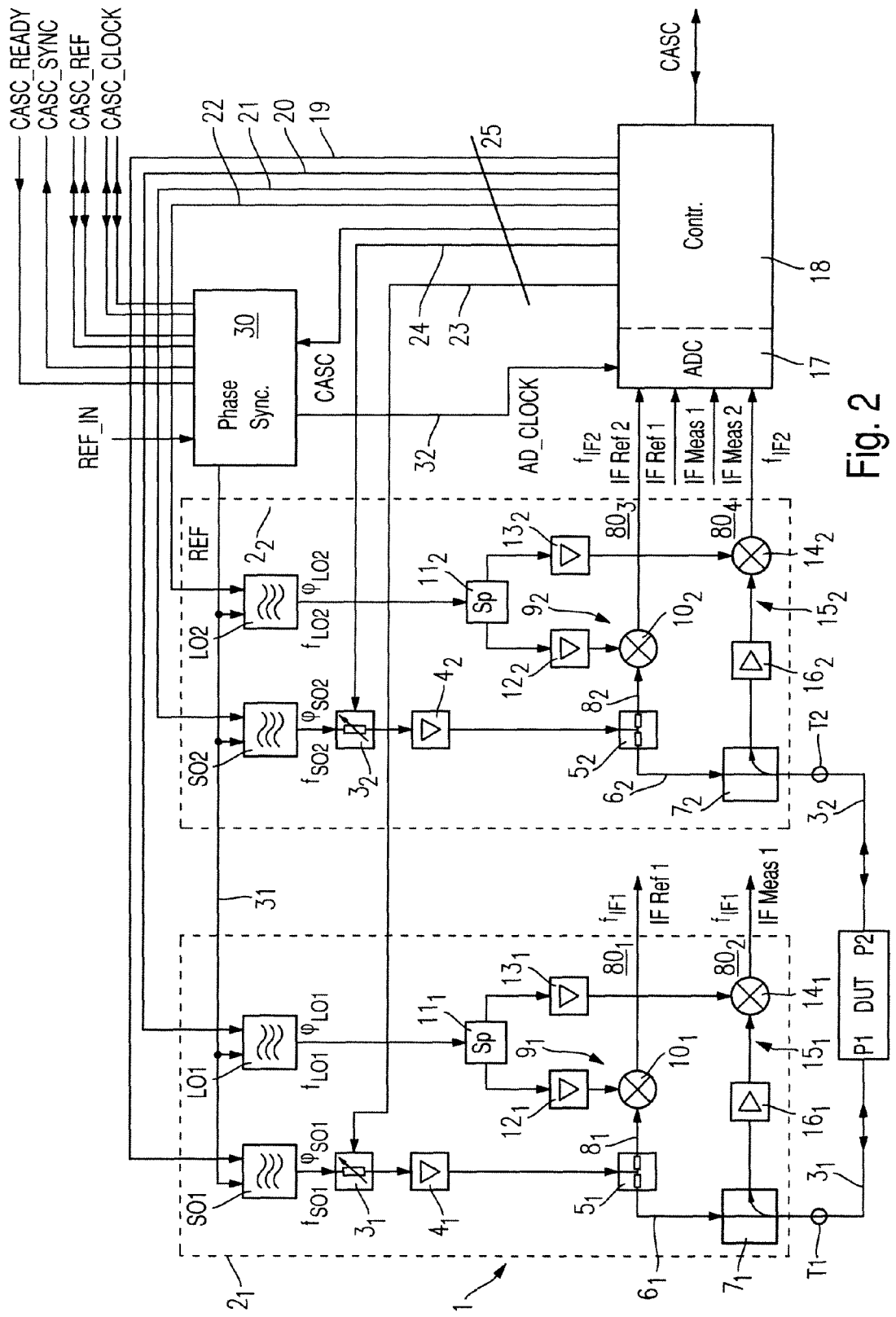
FIG. 2 shows an exemplary embodiment of the vectorial network analyzer with the phase synchronization according to FIG. 1.

By way of explanation of the need for the reference signal CASC_REF and the reference-clock-pulse signal CASC_CLOCK, FIG. 2 provides an example of the internal structure of a network analyzer. The network analyzers NA1 to NA4 shown in FIG. 1 can be structured internally according to the block circuit diagram presented in FIG. 2.

FIG. 2 shows an exemplary embodiment of one of the measuring devices NA1 to NA4, in which phase synchronization is used. In the exemplary embodiment shown, the measuring device is a vectorial network analyzer. However, the measuring device is not limited to network analyzers. The exemplary embodiment presented is a 2-port network analyzer NA1. In this context, it must be emphasized, that the phase synchronization concept in the vectorial network analyzers is not limited to 2-port network analyzers, but is also suitable for multi-port network analyzers with more than two test ports.

With the exemplary embodiment illustrated, a separate excitation/receiver unit $2_1$ or respectively $2_2$ is provided at each port T1, T2 of the network analyzer NA1. Each excitation/receiver unit $2_1$ or $2_2$ comprises a signal generator SO1 and respectively SO2, with which the device under test DUT can be supplied with an excitation signal. Either only one of the two signal generators SO1 or SO2 may be active, or both of the signal generators SO1 and SO2 respectively may provide an excitation signal.

In the application illustrated in FIG. 1, the device under test is an 8-port device. Each of the first two ports P1 and P2 of the device under test DUT is connected via a measurement line $3_1$ and respectively $3_2$ to one of the two ports T1 or T2 of the first network analyzer NA1.

The signal generators SO1 and SO2 are each connected via a variable attenuation element $3_1$ and respectively $3_2$ and an amplifier $4_1$ and respectively $4_2$ to a signal splitter $5_1$ and $5_2$. One signal branch $6_1$ and respectively $6_2$ is connected in each case via a bridge (e.g. directional coupler) $7_1$ and respectively $7_2$ to the allocated port T1 and T2. The other branch $8_1$ and respectively $8_2$ is connected to a mixer $10_1$ and respectively $10_2$ of a first receiver device $9_1$ and respectively $9_2$ of the respective excitation/receiver unit $2_1$ and $2_2$. When the associated signal generator SO1 and respectively SO2 is active, the first receiver device $9_1$ and respectively $9_2$ therefore receives the excitation signal. Furthermore, an oscillator signal, which is generated by an internal oscillator LO1 and respectively LO2 of the respective excitation/receiver unit $2_1$ and respectively $2_2$, is supplied to the mixer $10_1$ and respectively $10_2$. The oscillator signal is supplied to the mixer $10_1$ and respectively $10_2$ via a signal splitter $11_1$ and respectively $11_2$ and an amplifier $12_1$ and $12_2$.

Via the other signal branch of the signal splitters $11_1$ and respectively $11_2$ and a corresponding amplifier $13$ and respectively $13_2$, the same oscillator LO1 and respectively LO2 supplies a mixer $14_1$ and respectively $14_2$ of a second receiver device $15_1$ and respectively $15_2$ of the respective excitation/receiver unit $2_1$ and respectively $2_2$. The mixer $14$ and respectively $14_2$ is connected via an isolation amplifier $16_1$ and respectively $16_2$ and the bridge $7_1$ and respectively $7_2$ to the allocated port T1 and T2. Accordingly, the second receiver device $15_1$ receives the signal received by the associated port P1, reflected from the device under test to the port T1 or transmitted by the device under test DUT from the port T1 to the port T2. Accordingly, the second receiver device $15_2$ of the excitation/receiver unit $2_2$ receives the signal reflected from the device under test DUT to the port T2 or transmitted by the device under test DUT from the port T1 to the port T2. The mixers $10_1$ and $14_1$ of the first excitation/receiver unit $2_1$ convert the received signal into a first intermediate-frequency position with the intermediate frequency $f_{IF1}$, while the mixers $10_2$ and $14_2$ of the second excitation/receiver unit $2_2$ convert the received signal into a second intermediate-frequency position with the intermediate frequency $f_{IF2}$. In this context, the intermediate frequencies $f_{IF1}$ and $f_{IF2}$ are not necessarily identical.

The intermediate-frequency reference signal IF Ref 1 and respectively IF Ref 2 generated by the mixers $10_1$ and $10_2$, and the intermediate-frequency measurement signal IF Meas 1 and respectively IF Meas 2 generated by the mixers $14_1$ and respectively $14_2$ are supplied to an analog/digital converter 17, which is connected to a signal evaluation and control unit 18. An evaluation of the reference signals and measurement signals is implemented in this unit. Via control lines 19, 20, 21, and 22, the signal evaluation and control unit 18 also controls the signal generators SO1 and SO2 and the oscillators LO1 and LO2 in such a manner that these generate a signal with a predetermined frequency $f_{SO1}$, $f_{LO1}$, $f_{SO2}$ and respectively $f_{LO2}$ and with a predetermined phase $\phi_{SO1}$, $\phi_{LO1}$, $\phi_{SO2}$ and $\phi_{LO2}$.

The evaluation and control unit 18 is connected via further control lines 23 and 24 to the adjustable attenuation elements $3_1$ and $3_2$, so that the signal amplitude of the excitation signal generated by the signal generators SO1 and SO2 is controllable. Since the actual amplitude of the excitation signal can be registered via the intermediate-frequency reference signals IF Ref 1 and IF Ref 2, a control loop can be formed in this manner for the accurate control of the excitation amplitude.

The control lines 19 to 23 can be combined to form a bus system 25, in particular a LAN bus system. Differences in delay time, for example, in the measurement lines $3_1$ and $3_2$ can be compensated by a different setting of the phases $\phi_{LO1}$, $\phi_{LO2}$ and respectively $\phi_{SO1}$, $\phi_{SO2}$.

It must be emphasized once again, that the development according to the invention does not relate exclusively to network analyzers, but is also relevant for other measuring devices.

The network analyzer presented in FIG. 2 has a phase-synchronization unit 30, which receives and respectively transmits the signals CASC_READY, CASC_SYNC, CASC_REF and CASC_CLOCK described with reference to FIG. 1 from and respectively to the network analyzers. The control unit 18 establishes whether the respective network analyzer is the master or a slave. For instance, the operator of the respective network analyzer can make an entry to the effect that this network analyzer NA1 is to be the master device. This network analyzer NA1 then transmits the signal CASC to the other network analyzers NA1-NA4, which accordingly acknowledge that they are the slave network analyzers in the measuring task to be implemented. Moreover, the signal CASC is transmitted to the phase-synchronization unit 30, where switching devices, which will be explained with reference to FIG. 3, are then activated.

The phase-synchronization unit 30 is connected to the signal generators SO1 and SO2 and to the local oscillators LO1 and LO2 via a connecting line 31, to which it specifies a main reference signal REF. The phase-synchronization unit 30 is connected via a connecting line 32 to the analog/digital converter 17, to which it communicates the clock-pulse signal AD_CLOCK in order to establish the sampling time. The auxiliary reference signal REF_IN required in order to generate the main reference signal REF can either be supplied externally or can be generated within the network analyzer.

FIG. 3 shows an exemplary embodiment of the structure of the phase synchronization unit 30 in the form of a block circuit diagram. A controllable oscillator 39 generates the main reference signal REF. A first phase detector 33 receives a first comparison signal V1. In the exemplary embodiment illustrated, the first comparison signal V1 is derived from the main reference signal REF by dividing the frequency of the main reference signal by a first division factor T1 in a first divider 34. The second comparison signal V2, of which the phase is compared with the phase of the first comparison signal V1, is derived from the auxiliary reference signal REF_IN. For this purpose, the frequency of the auxiliary reference signal REF_IN in the exemplary embodiment illustrated is divided by a second division factor T2 in a second divider 35. Accordingly, a control signal, which represents a measure for the phase deviation between the two comparison signals V1 and V2, is provided at the output of the first phase detector 33. This signal can be supplied as a control signal UREG via a first switching device 36 to a control input 34 of the oscillator 39.

The switching position illustrated in FIG. 3 corresponds to the situation that the device NA1 allocated to the phase-synchronization unit 30 is the master device. In this situation, the first switching device 36 connects the output of the first phase detector 33 to the control input 37 of the controlled oscillator 39. However, if the associated device is a slave, the first switching device 36 is disposed in the upper switching position and connects the output of a second phase detector 38 to the control input 37 of the oscillator 39.

The first comparison signal V3, which is supplied to the second phase detector 38, is the main reference signal REF. The other comparison signal is the main reference signal of the master device, which, in the exemplary embodiment, is supplied via a two-wire connecting line 40 and a transformer 41 to the other input of the second phase detector 38. A second switching device 42 connects the connecting line 43 only if the associated device is the master device. If the device is a slave, the line 43 is therefore open. In this case, a phase comparison is therefore implemented between the main reference signal REF and the reference signal CASC_REF supplied by the master device.

In the switching position shown in FIG. 3 for the master operating mode, there is therefore a phase-locked loop from the output of the oscillator 39 via the divider 34 and the phase detector 33 to the control input 37 of the oscillator 39, wherein the phase comparison is implemented with the auxiliary reference signal REF_IN. By contrast, in the slave operating mode, there is a phase-locked loop from the output of the oscillator 39 via the second phase detector 38 to the control input 37 of the oscillator 39, wherein the phase comparison is then implemented with the main reference signal REF of the master device. In this manner, it can be ensured, that the phase-locked loops of all devices operate synchronously relative to one another, and the oscillators 39 of all devices generate phase-synchronous reference signals REF, which are supplied to the respective signal generators SO1, SO2 and local oscillators LO1, LO2 of the respective devices, which then also operate synchronously relative to one another. This will be described in greater detail below with reference to FIG. 4.

In one preferred exemplary embodiment, a further object of the phase-synchronization unit 30 is to ensure the synchronicity of the clock-pulse signals of the analog/digital converter. For this purpose, a third phase detector 44 is provided, which compares the phase of a fourth comparison signal V4 with the phase of a fifth comparison signal V5. The fifth comparison signal V5 is derived via a third divider 45 from the clock-pulse signal AD_CLOCK, wherein the third divider 45 divides the frequency of the clock-pulse signal AD_CLOCK by a third division factor T3. The fourth comparison signal V4 is derived via a fourth divider 50 from the main reference signal REF, wherein the fourth divider 50 divides the frequency of the main reference signal REF by the division factor T4. The clock-pulse signal AD_CLOCK for the analog/digital converter 17 is generated by means of a second oscillator 46, of which the control input 47 can be connected via a third switching device 48 to the output of the third phase detector 44. This connection is only connected via the signal CASC, if the relevant device is the master device. If the device is a slave, the third switching device 48 connects the control input 47 of the second oscillator 46 to the output of a fourth phase detector 49.

However, if the device is a slave, the third switching device 48 connects the control input 47 of the second oscillator 46 to the output of a fourth phase detector 49. One of the comparison signals, which are supplied to the fourth phase detector 49, is the clock-pulse signal AD_CLOCK generated by the second generator 46. The other comparison signal is the clock-pulse signal CASC_CLOCK, which is supplied by the master device via the two-wire connecting line 51 and the transformer 52. A fourth switching device 54 is only connected, if the respective device is the master device. This ensures that the clock-pulse signal AD_CLOCK generated by this master device is transmitted via the two-wire line 50 as the clock-pulse signal CASC_CLOCK to the slaves and can be used there for the synchronization of the clock-pulse signals. Accordingly, all of the clock-pulse signals AD_CLOCK generated by the respective phase-synchronization unit 30 in the respective devices are synchronized with one another.

Here also, a first, closed phase-locked loop is formed by the second oscillator 46, the third divider 45 and the third phase detector 44, if the respective device is the master device, wherein this phase-locked loop synchronizes to the main reference signal REF. Alternatively, a second, closed phase-locked loop is formed by the generator 46 and the fourth phase detector 49, if the respective device is the slave device, wherein, in this case, the synchronization relates to the external clock-pulse signal CASC_CLOCK.

Furthermore, a process-control unit 53 is preferably provided. The process-control unit 53 of the master device sends the command CASC_SYNC to all slave devices, which activate the switching devices 36, 42, 48 and 54 in response. Confirmation that the switching is complete is sent to the master device via the signal CASC_READY.

Figure 4:
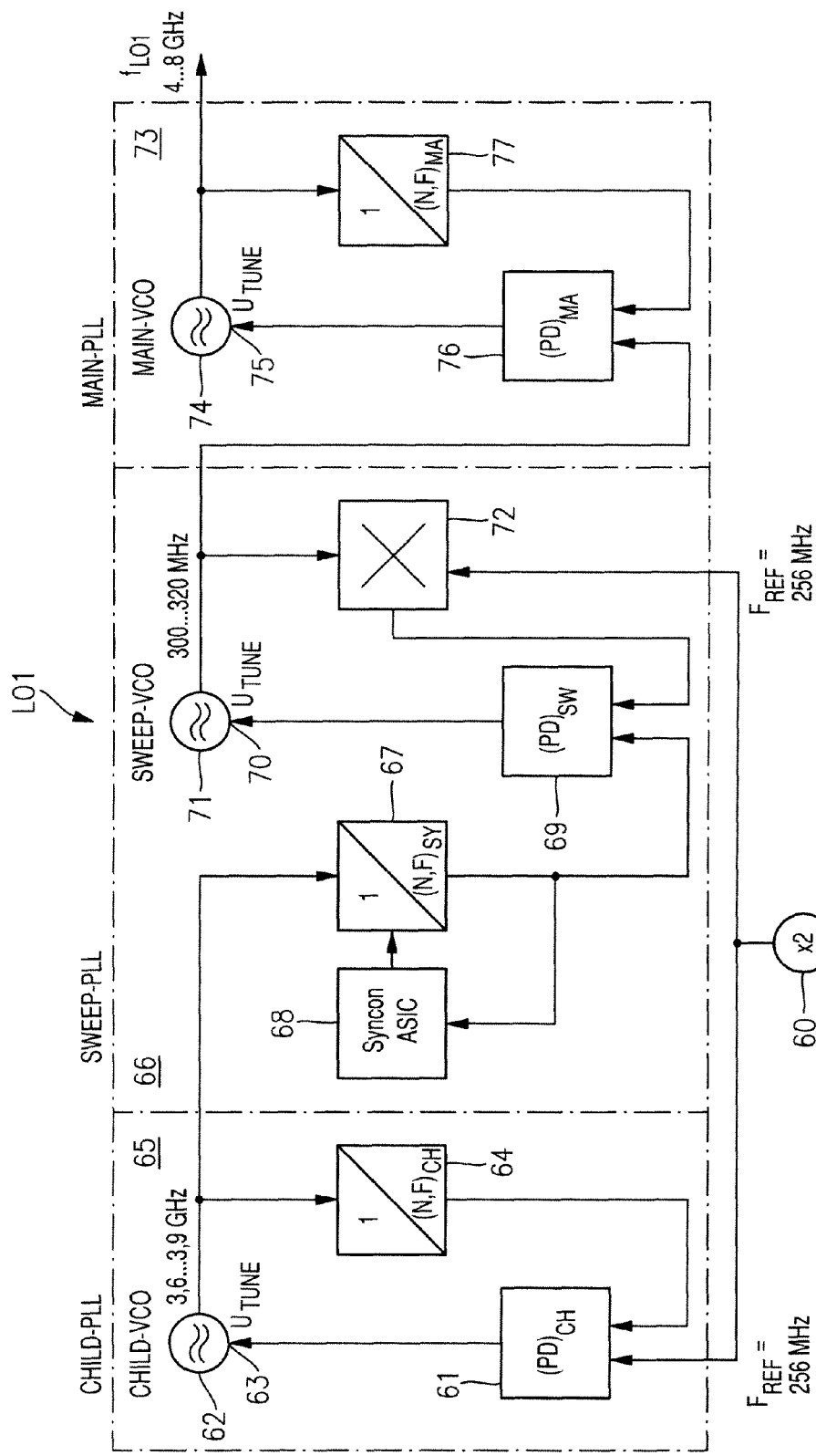
FIG. 4 shows an exemplary embodiment of a local oscillator, which can be used for the phase synchronization according to the invention.

FIG. 4 shows one possible realization of one of the local oscillators LO1. Within the framework of the invention, any other realizations required are also possible. FIG. 4 is intended merely to visualise one possible use of the main reference signal REF.

The main reference signal REF is transmitted from the phase-synchronization unit 30 to the local oscillator LO1 via the connecting line 31. In the exemplary embodiment, the frequency of the main reference signal REF is initially doubled in a frequency doubler 60 and supplied within the local oscillator LO1 to a first comparison input of a phase-detector 61. The output of the phase detector 61 is connected to the control input 63 of a first oscillator 62. The output of the first oscillator 62 is connected via a first fractional divider 64 to the second comparison input of the first phase detector 61. Consequently, the first oscillator 62 together with the divider 64 and the first phase detector 61 forms a first phase-locked loop PLL, which is synchronized with the main reference signal REF. This first phase-locked loop in stage 65 is also referred to as the Child_PLL. The divider 64 divides the frequency by the fractional-rational division factor $(N.F)_{CH}$ with the integer component N and the non-integer component F after the decimal point.

The subsequent stage 66 is described as the Sweep_PLL. A second divider 67 is provided here, which is connected to the output of the first oscillator 62. A synchronization component 68 ensures the selection of the fractional-rational division factor $(N.F)_{SY}$ of the divider 67. The output of the second divider 67 is connected to a first comparison input of a second phase detector 69, of which the output is, once again, connected to the control input 70 of a second oscillator 71. The output of the second oscillator 71 is connected to a first input of a mixer 72. A second input of the mixer 72 receives the main reference signal REF doubled by the frequency doubler 60. The output of the mixer 72 is connected to the second comparison input of the second phase detector 69. In this manner, a second phase-locked loop, which is also synchronized via the main reference signal REF, is formed by the second oscillator 71, the mixer 72 and the phase detector 69.

A third oscillator 74, of which the control input 75 is connected to a third phase detector 76, is disposed in a third stage 73, which is referred to as the Main_PLL. A first comparison input of the third phase detector 76 is connected to the output of the second oscillator 71, while a second comparison input of the third phase detector 76 is connected via a third divider 77 to the output of the third oscillator 74. The local oscillator signal with the frequency $f_{LO1}$ is available at the output of the third oscillator 74, which is also referred to as the main oscillator. In this context, the frequency $f_{LO1}$ can be tuned over an octave, in the exemplary embodiment, from 4 GHz to 8 GHz. The divider 77 divides the frequency in a similar manner by a fractional-rational division factor $(N.F)_{MA}$.

A synchronization of the signal generators SO and the local oscillators LO is achieved by the phase-synchronization unit 30 in each of the interconnected devices. At the same time, the sampling rates of the analog/digital converter 17 are synchronized. Short control times or transient times can be achieved as a result of the clear subordination of the slave devices beneath one master device.

The present invention is concerned with how several interconnected measuring devices, especially network analyzers, which can be fitted with a phase-synchronization device, for example, as has been described above with reference to FIGS. 1 to 4, can be operated in such a manner that the phase synchronization is preserved in the event of a frequency change. However, it must be emphasized, that the phase synchronization need not necessarily be achieved in the manner described above; any other known method, for example the method specified in DE 103 31 092 A1, is also suitable for the phase synchronization.

Figure 5:
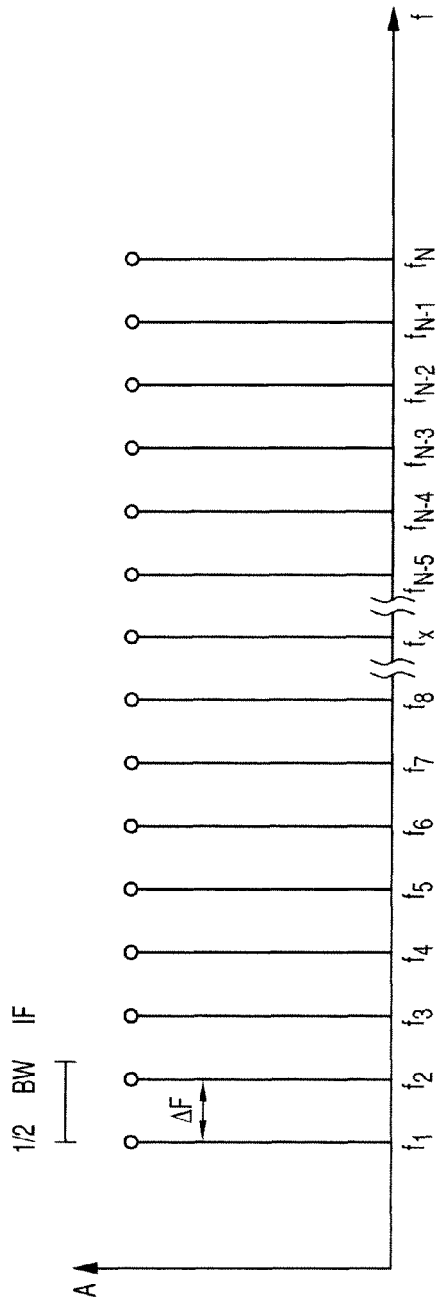
FIG. 5 shows a diagram explaining the frequency change.

An initial calibration measurement, in which the phase relationship is determined on the basis of calibration standards, and the calibration standard is then replaced by the unknown device under test DUT, is conventionally implemented. The device under test should be tested with a plurality of test frequencies. As shown in FIG. 5, the frequency interval, in which the test parameters, for example, the S-parameters, are relevant, is subdivided for this purpose into N-frequency points between the start frequency $f_1$ and an end frequency $f_N$. In general, equidistant intervals $\Delta F$ are used between the frequency stations $f_i$.

If a phase calibration, which is maintained between the individual network analyzers NA1 to NA4 via the local phase-synchronization units 30 using the measures described above with reference to FIGS. 1 to 4, has been achieved via calibration standards at the start frequency $f_1$, the problem arises of how this phase synchronization can be maintained in the event of a change of the measurement frequency $f_1$ to the next higher measurement frequency $f_2$. This is the starting point for the present invention.

In the event of a frequency change, both the frequencies $f_{SO1}$ and respectively $f_{SO2}$ of the signal generators SO1 and respectively SO2 active during the excitation of all those devices, which excite at least one port P1 to P8 of the device under test DUT with an excitation signal, must be varied, and also the frequency $f_{LO1}$ and respectively $f_{LO2}$ of all local oscillators LO1 and respectively LO2 of all devices to all ports, which receive a measurement signal reflected from or transmitted by the device under test DUT. In this context, the frequencies $f_{SO1}$ and respectively $f_{SO2}$ of the signal generators SO1 and respectively SO2 must be varied by the same step width $\Delta f$ as the frequencies $f_{LO1}$ and respectively $f_{LO2}$ of the local oscillators LO1 and respectively LO2 in order to ensure that the resulting intermediate frequency $f_{IF1}$ and respectively $f_{IF2}$ ultimately does not change in the event of a frequency change, that is to say, that the anticipated, measurement signal falls in the middle of the pass-bandwidth of the intermediate-frequency range $80_1$, $80_2$, $80_3$ and respectively $80_4$ adjoining the mixers $10_1$, $10_2$ and respectively $14_1$ and $14_2$.

However, in this context, the phase synchronization cannot be maintained, if the frequencies $f_{SO1}$ and respectively $f_{SO2}$ of the signal generators SO1 and respectively SO2 and the frequencies $f_{LO1}$ and respectively $f_{LO2}$ of the local oscillators LO1 and respectively LO2 are varied simultaneously. The invention therefore proposes varying initially only the frequencies $f_{LO1}$ and respectively $f_{LO2}$, and during this stage leaving the frequencies $f_{SO1}$ and respectively $f_{SO2}$ of the signal generators SO1 and respectively SO2 unchanged. This has the advantage that the excitation of the device under test DUT in this first stage of the frequency change is not varied, and therefore any phase change, which may occur during this first stage of the frequency change, cannot originate from the device under test DUT, but can only be caused by the frequency change of the oscillator frequencies $f_{LO1}$ and respectively $f_{LO2}$. In this first stage, the frequencies of all local oscillators in all the devices connected together in the measuring procedure are varied, that is to say, the frequencies of the local oscillators of all devices which receive the measurement signal.

The phase change occurring during this first stage, which originates from the frequency change of the local oscillators, is now known and can either be corrected or compensated or included in the subsequent evaluation calculations for the measurement results. In the case of the exemplary embodiment illustrated in FIG. 2, the phase $\phi_{LO1}$ and respectively $\phi_{LO2}$, which can be specified by the control unit 18, can be varied by way of correction in such a manner that the phase condition before the first stage of the frequency change is once again achieved. If the phase change occurring during the first stage is to be taken into consideration in a subsequent evaluation instead of being corrected, it is advisable to store this phase change in a memory.

The change in the frequency $f_{SO1}$ or respectively $f_{SO2}$ of the signal generators SO1 and respectively SO2 active in the concrete measurement task is not implemented until a second stage. If the device under test DUT illustrated in FIG. 1 is excited, for example, at its ports P1 and P2 by the first network analyzer NA1, with a differential signal (differential mode), only the signal generators SO1 and SO2 of the first network analyzer NA1 should be varied in their frequency in this second stage. The signal generators of the other network analyzers NA2, NA3 and NA4 are not active in this measurement task, but are switched off and need not therefore be varied. In this second stage, the excitation of the device under test DUT is varied. This change in excitation can lead to phase changes, which must, however, be measured. For example, if the device under test is a band-pass filter, the phase at the flanks of the band-pass filter will vary strongly with the change of frequency. This phase change will have an influence, for example, on the complex S-parameters to be measured.

With the two-stage procedure according to the invention, phase changes caused by a change in the oscillator frequencies can be separated from phase changes, which are caused by a change in the frequency of the signal generators and therefore by a change in the excitation of the device under test DUT. The phase changes caused by a change in the frequency of the local oscillators should have no influence on the measurement result and can either be corrected, compensated or calculated out of the measurement result.

However, with the procedure according to the invention, it must be taken into consideration that the step width $\Delta F$ of the frequency change, that is to say, the frequency change from the frequency point $f_I$ to the next frequency point $f_{I+1}$ must be smaller than half the bandwidth of the intermediate frequency range $80_1$, $80_2$, $80_3$ and $80_4$ of the measuring devices respectively adjoining the mixers $10_1$, $10_2$, $14_1$ and $14_2$, because if only the frequencies of the local oscillators, but not the excitation frequencies are varied, the position of the intermediate frequency IF changes. This can be explained with reference to FIG. 6.

Figure 6:
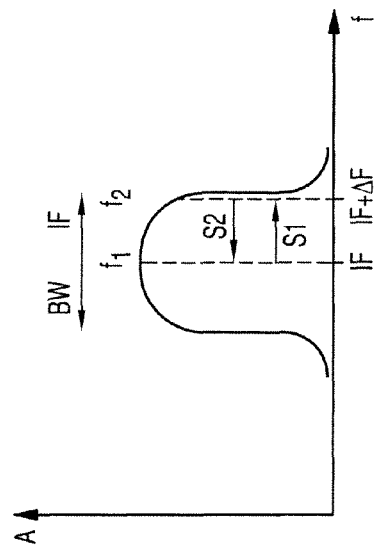
FIG. 6 shows a diagram explaining the relationship between the step width in the frequency change and the intermediate-frequency bandwidth.

In FIG. 6, it is assumed that the frequencies $f_{LO1}$ and respectively $f_{LO2}$ of the local oscillators LO1 and respectively LO2 are greater than the frequencies $f_{SO1}$ and respectively $f_{SO2}$ of the signal generators SO1 and respectively SO2. For example, at the transition from frequency point $f_1$ and frequency point $f_2$, if the frequency $f_{LO1}$ or respectively $f_{LO2}$ of the local oscillators LO1 or respectively LO2 is initially increased (stage S1), the position of the intermediate frequency is increased by this frequency step width $\Delta F$ from IF to IF+$\Delta F$. In order to ensure that the signal, which has been varied in its intermediate-frequency position, can still be received, the step width of the frequency change $\Delta F$ must therefore be smaller than half the bandwidth ½ BW of the intermediate frequency ranges $80_1$ to $80_4$. In stage S2, if the frequency $f_{SO1}$ or respectively $f_{SO2}$ of the signal generators SO1 and respectively SO2 is then also changed, the intermediate frequency IF resulting at the mixers $10_1$, $10_2$, $14_1$ and $14_2$ once again falls in the middle of the bandwidth BW of the intermediate frequency ranges $80_1$ to $80_4$.

The frequency steps typically used in network analysis are generally significantly smaller than the bandwidth of the intermediate-frequency ranges. However, the return from the end frequency $f_N$ to the start frequency $f_1$ is more problematic. This return is necessary, because the frequency sweep is generally implemented several times during the measurement, and then averaged over the several measurements. The return from $f_N$ to $f_1$ is in fact not time critical, but should not last too long so that the measurement as a whole is not delayed excessively.

One first solution to this problem could be that individual frequency points in the returns are, in fact, omitted, but so many intermediate values are used that it can be ensured, that the bandwidth of the intermediate-frequency ranges is not left.

Another, more efficient possibility is initially to vary only the integer component of the division factors in the dividers 64, 67 and 77 of the local oscillators LO1 and respectively LO2 illustrated in FIG. 4, and initially to leave the non-integer component or respectively the component F after the decimal point unchanged. In fact, in the case of the closed loops of the PLLs, if only the integer component of the division factor is changed, the phase position at the output of each individual PLL stage (CHILD_PLL, SWEEP_PLL, and MAIN_PLL) is not changed, so that this rough frequency change has no influence on the phase position of the output signal $f_{LO1}$. Exactly the same procedure can be used with the signal generators SO1 and SO2.

The remaining fine frequency change—which corresponds to an adaptation of the component F after the decimal point of the division factors of the PLL synthesisers of the local oscillators LO1 and respectively LO2 and of the signal generators SO1 and respectively SO2—can now be implemented using the method according to the invention explained above. In this context, as illustrated above, only the frequency of the local oscillators is initially varied in a first partial stage, the frequency of the signal generators being changed subsequently in a second partial stage. The step width of this remaining, fine frequency change is then generally so small that it is smaller than half the bandwidth of the intermediate-frequency ranges, and can therefore be implemented in one stage without difficulty. Accordingly, even relatively-large frequency variations can be implemented successfully using the expansion of the method according to the invention as described above.

If the influence of the device under test DUT on the evaluation is slight because of the good insulation, that is to say, the good de-coupling of the directional coupler 71 or respectively 72, it is also possible to proceed in the reverse order; that is to say, in a first stage, only the frequency of the signal generator SO1 or respectively SO2 is initially varied, and, in a second stage, only the frequency of the local oscillator LO is varied.

The invention is not restricted to the exemplary embodiment illustrated. In particular, other measuring devices, such as spectrum analyzers or oscilloscopes, that is to say, not exclusively network analyzers, can be considered as measuring devices. With regard to network analyzers, alternative exemplary embodiments, especially with only one local oscillator LO1 or respectively LO2 for two or more ports or only one signal generator SO1 or respectively SO2, which can be switched between two or more ports of the network analyzer, may also be considered. Moreover, the local oscillators LO can provide a different design from that illustrated in FIG. 4. The phase synchronization, which precedes the method, or upon which the method is based, can also be implemented differently than was described with reference to FIGS. 1 to 3, for example according to DE 103 31 092 A1.

The invention claimed is:

1. Method for implementing a frequency change while retaining a phase relationship between a plurality of devices wherein each device comprises at least one signal generator for exciting a device under test and at least one local oscillator connected to at least one mixer for receiving a test signal obtained from the device under test according to the superposition principle, comprising
in the event of said frequency change, (a) initially varying only a frequency of the local oscillator of each of said devices, and maintaining a frequency of the signal generator of each of said devices, and (b) then varying only a frequency of at least one signal generator, and maintaining a frequency of the local oscillator of each of said devices, or,
in the event of said frequency change, (a) initially varying only a frequency of at least one signal generator, and maintaining a frequency of the local oscillator of each of said devices, and (b) then varying only a frequency of the local oscillator of each of said devices, and maintaining the frequency of the signal generator of each of said devices.

2. Method according to claim 1, comprising registering a phase position at an output of the mixer of each device before and after (a).

3. Method according to claim 2, comprising correcting the difference of the phase position before and after (a) by adjusting the phase position of the local oscillator of a device and/or of a signal generator.

4. Method according to claim 2, comprising including a difference of the phase position before and after (a) in an evaluation calculation.

5. Method according to claim 1 wherein each local oscillator and each signal generator comprises at least one phase-locked loop with at least one divider, which implements a frequency division by a fractional-rational division factor, comprising
in the event of a coarse frequency change, initially varying an integer component of the division factor of each local oscillator and of at least one signal generator; and,
in the event of a subsequent fine frequency change (c) initially varying only a non-integer component of the division factor of each local oscillator, and maintaining the non-integer component of the division factor of the at least one signal generator; and (d) varying only the non-integer component of the division factor of the at least one signal generator, and maintaining the non-integer component of the division factor of all local oscillators, or,
in the event of a subsequent fine frequency change, (c) initially varying only a non-integer component of the division factor of the at least one signal generator, and maintaining the non-integer component of the division factor of all local oscillators; and (c) varying only the non-integer component of the division factor of each local oscillator, and maintaining the non-integer component of the division factor of the at least one signal generator.

6. Method according to claim 1, wherein a step width ($\Delta F$) of the frequency change in (b) is smaller than half a bandwidth of an intermediate-frequency range adjoining the mixers.

* * * * *